(12) United States Patent
Abdo et al.

(10) Patent No.: US 11,515,461 B2
(45) Date of Patent: Nov. 29, 2022

(54) SUPERCONDUCTOR DEVICES HAVING BURIED QUASIPARTICLE TRAPS

(71) Applicant: International Business Machines Corporation, Armonk, NY (US)

(72) Inventors: Baleegh Abdo, Fishkill, NY (US); Sarunya Bangsaruntip, Mount Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 444 days.

(21) Appl. No.: 16/728,504

(22) Filed: Dec. 27, 2019

(65) Prior Publication Data

US 2021/0280766 A1 Sep. 9, 2021

(51) Int. Cl.
*H01L 39/24* (2006.01)
*G06N 10/00* (2022.01)

(52) U.S. Cl.
CPC ......... *H01L 39/2461* (2013.01); *G06N 10/00* (2019.01)

(58) Field of Classification Search
CPC .......................... G06N 10/00; H01L 39/2461
USPC ......................................................... 505/237
See application file for complete search history.

(56) References Cited

U.S. PATENT DOCUMENTS

| 6,365,912 | B1 | 4/2002 | Booth et al. |
| 6,581,387 | B1 | 6/2003 | Ullom |
| 6,979,836 | B2 | 12/2005 | Zagoskin et al. |
| 9,713,199 | B2 | 7/2017 | Freedman et al. |
| 10,256,392 | B1 * | 4/2019 | Brink .................... B82Y 10/00 |
| 10,367,133 | B1 | 7/2019 | Tahan |

FOREIGN PATENT DOCUMENTS

JP 2004111751 4/2004

OTHER PUBLICATIONS

Song et al., "Microwave response of vortices in superconducting thin films of Re and Al," Phys. Rev. B 79,174512, May 29, 2009, 9 pages.
Catelani et al., "Quasiparticle Relaxation of Superconducting Qubits in the Presence of Flux," Phys. Rev. Lett. 106, 077002, Feb. 16, 2011, 4 pages.
Wang et al., "Measurement and control of quasiparticle dynamics in a superconducting qubit," Nature Communications, Dec. 18, 2014, 7 pages.
Sun et al., "Measurements of Quasiparticle Tunneling Dynamics in a Bandgap-Engineered Transmon Qubit," Phys. Rev. Lett. 108, 230509 (2012), Dec. 12, 2011, 11 pages.

(Continued)

*Primary Examiner* — Monica D Harrison
(74) *Attorney, Agent, or Firm* — Amin, Turocy & Watson, LLP

(57) ABSTRACT

Techniques for trapping quasiparticles in superconductor devices are provided. A superconductor device can comprise a substrate layer. The superconductor device can further comprise a first superconductor layer composed of a first superconductor material, on a first surface of a substrate layer. The superconductor device can further comprise a trapping material buried in the first superconductor layer, wherein the trapping material is formulated to trap quasiparticles.

20 Claims, 10 Drawing Sheets

(56) References Cited

OTHER PUBLICATIONS

Catelani et al., "Relaxation and frequency shifts induced by quasiparticles in superconducting qubits," Phys. Rev. B 84, 064517 (2011), Jun. 4, 2011, 25 pages.
Nsanzineza et al., "Trapping a Single Vortex and Reducing Quasiparticles in a Superconducting Resonator," Phys. Rev. Lett. 113, 117002, Sep. 12, 2014, 5 pages.
Martinis et al., "Energy Decay in Superconducting Josephson-Junction Qubits from Nonequilibrium Quasiparticle Excitations," Phys. Rev. Lett. 103, 097002, Aug. 26, 2009, 5 pages.
Pop et al., "Coherent suppression of electromagnetic dissipation due to superconducting quasiparticles," Nature, vol. 508, Apr. 17, 2014, 18 pages.
Lenander et al., "Measurement of energy decay in superconducting qubits from nonequilibrium quasiparticles," Phys. Rev. B 84, 024501, Jul. 1, 2011, 10 pages.
Goldie et al., "Quasiparticle trapping from a single-crystal superconductor into a normal-metal film via the proximity effect," Phys. Rev. Lett. 64, 954, Feb. 19, 1990, 5 pages.
Riwar et al., "Normal-metal quasiparticle traps for superconducting qubits," Phys. Rev. B 94, 104516, Jun. 16, 2016, 11 pages.
Riwar et al., "Efficient quasiparticle traps with low dissipation through gap engineering," arXiv:1907.04781v1 [cond-mat.supr-con], Jul. 10, 2019, 14 pages.

\* cited by examiner

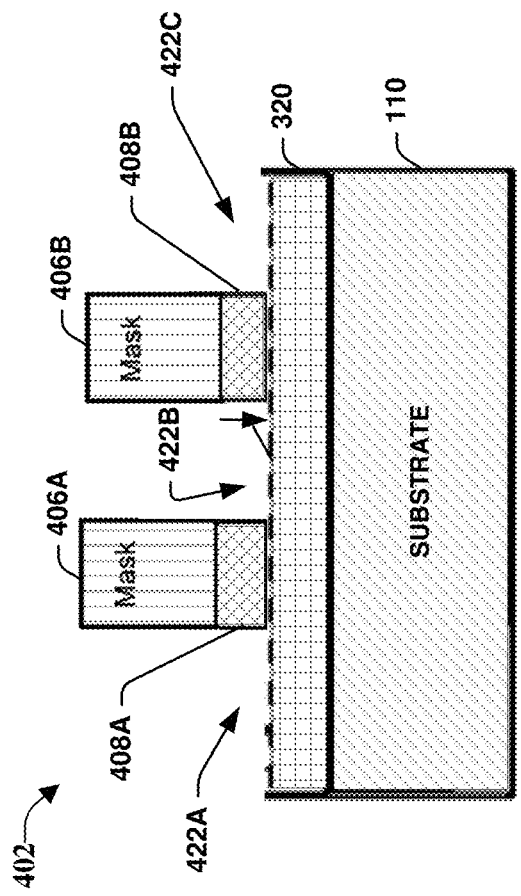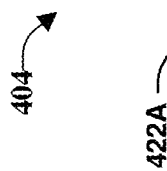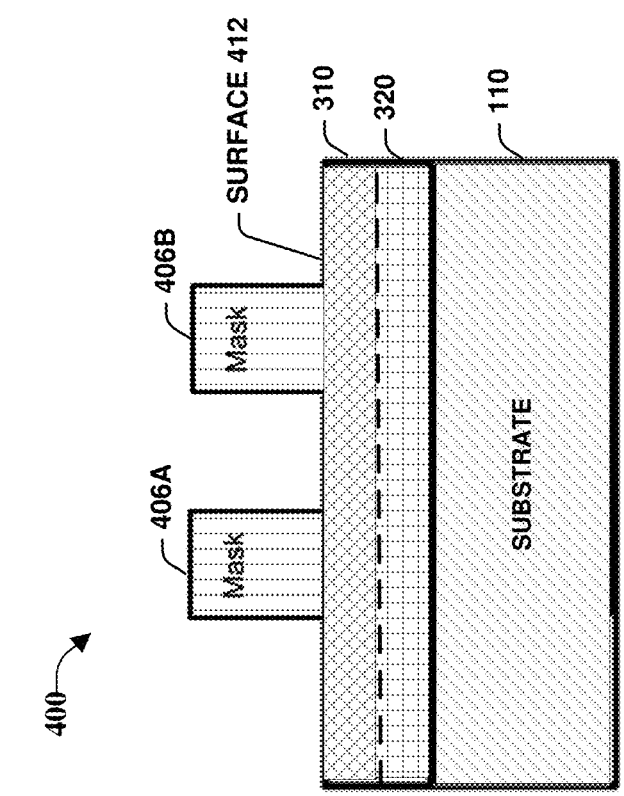

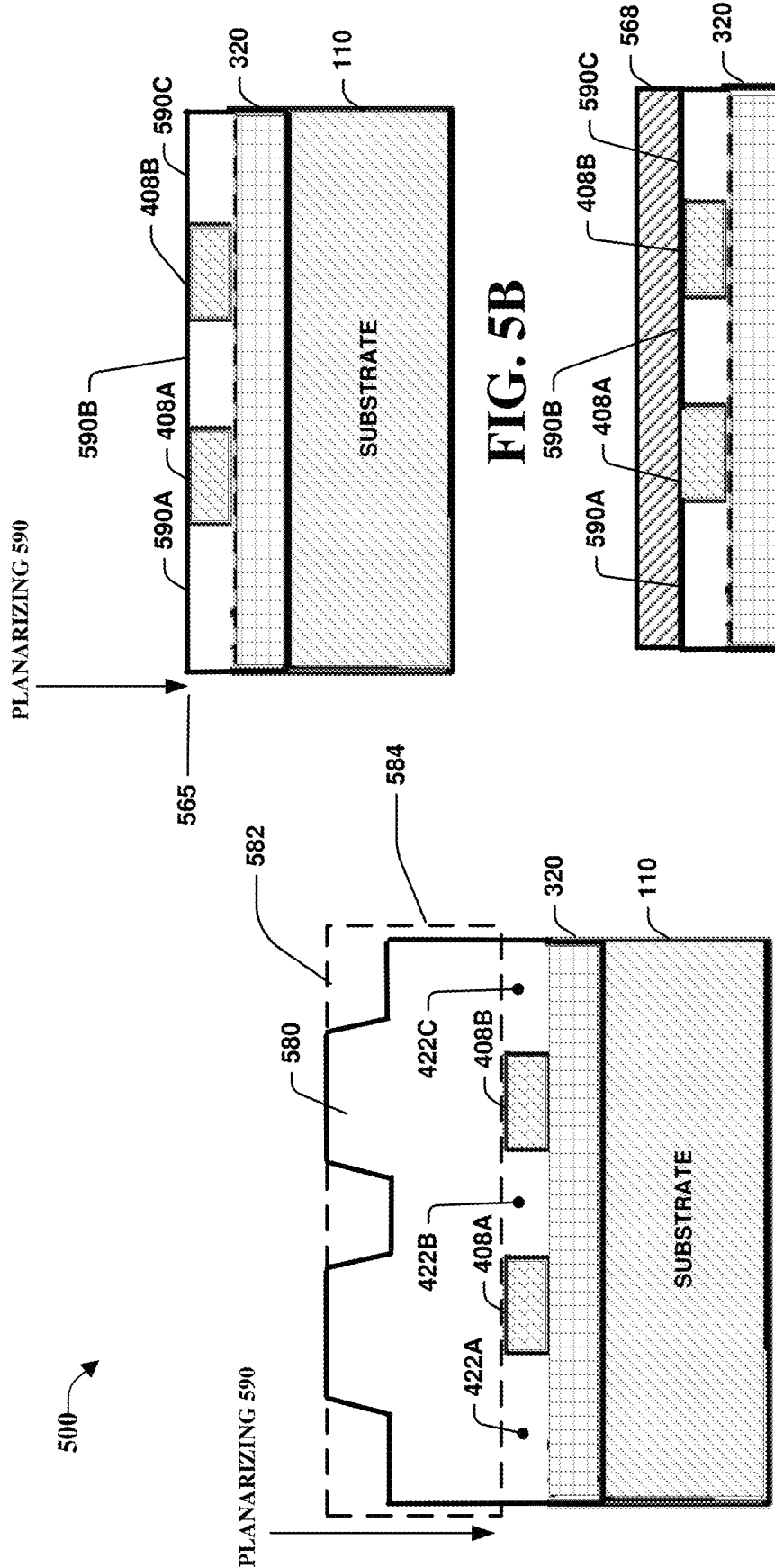

SUPERCONDUCTOR DEVICES HAVING BURIED QUASIPARTICLE TRAPS

BACKGROUND

The subject disclosure relates to superconductor devices, and more specifically, to superconductor devices having trapped quasiparticles.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, devices, systems, methods, and computer-implemented methods are described that can facilitate burying quasiparticle traps in superconductor devices.

According to an embodiment, a system can comprise a superconductor that includes a substrate layer, a first superconductor layer composed of a first superconductor material, on a first surface of a substrate layer, and a trapping material buried in the first superconductor layer. In this embodiment, the trapping material can be formulated to trap quasiparticles, and the trapping material is buried within the first superconductor layer to a depth exceeding a depth to which a magnetic field can penetrate the superconductor material of the first superconductor layer. The system can further comprise a second superconductor layer on a second surface of the first superconductor layer opposite to the first surface of the substrate layer, and the second superconductor layer can contact the trapping material.

In the system above, the second superconductor layer can be composed of second superconductor material that is different from the first superconductor material. Further, the second superconductor layer can have a thickness exceeding a depth to which a magnetic field can penetrate the superconductor material of which the first superconductor layer is comprised.

A method can comprise depositing a first superconductor layer on a first surface of a substrate material, and burying a trapping material that traps quasiparticles in the first superconductor layer. In the method, the trapping material can be formulated to trap quasiparticles. Further, the burying of the trapping material can comprise depositing the trapping material in a recess formed in a second surface of the first superconductor layer opposite to the first surface of the substrate material, and depositing a second superconductor layer on the second surface of the first superconductor layer, with the depositing of the second superconductor layer covering the recess and burying the trapping material in the combined first superconductor layer and the second superconductor layer.

In the method described above, the depositing of the trapping material in the recess can comprise depositing the trapping material on the second surface of the first superconductor layer, such that the recess can be filled with the trapping material and excess trapping material can form an excess material layer over the second surface, and removing the excess trapping material not inside the recess. Further, the depositing of the trapping material in the recess can comprise depositing the trapping material in the recess without forming an excess material layer over the second surface of the first superconductor layer.

A method described herein can comprise providing a superconductor material, providing a trapping material that can be formulated to trap quasiparticles, and combining, on a substrate material the superconductor material with the trapping material, and the trapping material can be combined so as to be buried within the superconductor material. Further, the trapping material can be discretely buried in the superconductor material so as to form buried trapping material pieces. In a variation, the buried trapping material pieces can be formed to be spaced at a regular intervals from each other. Further, at least two of the buried trapping material pieces can be formed to have the same shape, with the shape being a rounded shape. Alternatively, in the method, the method can be a wherein the same shape is a non-rounded shape. In additional features, at the buried trapping material pieces can be formed to be spaced at a regular interval from each other. In the method, the buried trapping material pieces can be formed to be along a ground plane of the superconductor material. Further, the trapping material can be comprised of a metallic material. In the method, the trapping material can be combined so as to be buried within the superconductor material at a depth exceeding the depth to which a magnetic field can penetrate the superconductor material. In another feature, a first surface of the buried trapping material can be formed to be separated from a second surface of the substrate material in contact with the superconductor material.

DESCRIPTION OF THE DRAWINGS

FIG. 4A illustrates an example aspect of an approach to fabricating a superconductor device, in accordance with one or more embodiments.

FIG. 4B depicts an example of an approach to fabricating superconductor device, in accordance with one or more embodiments.

FIG. 4C illustrates an example approach to fabricating a superconductor device, in accordance with one or more embodiments.

FIG. 5A illustrates an example approach to fabricating a superconductor device, in accordance with one or more embodiments.

FIG. 5B illustrates an example approach to fabricating a superconductor device, in accordance with one or more embodiments.

FIG. 5C illustrates an example approach to fabricating a superconductor device, in accordance with one or more embodiments.

DETAILED DESCRIPTION

Figure 1:
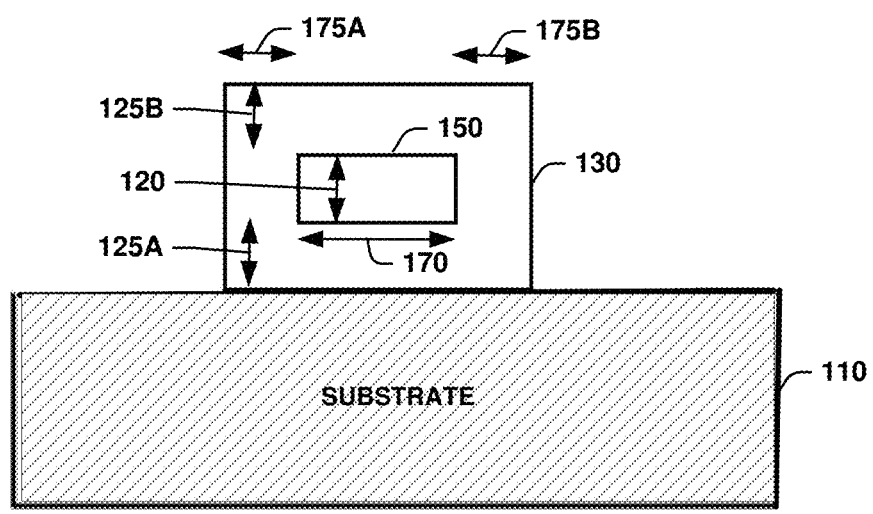
FIG. 1 illustrates a cross sectional view of example superconductor device with buried trapping material, in accordance with one or more embodiments.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

It should be appreciated that the embodiments of the subject disclosure depicted in various figures disclosed herein are for illustration only, and as such, the architecture of such embodiments are not limited to the systems, devices, and/or components depicted therein.

Quantum computing is generally the use of quantum-mechanical phenomena for the purpose of performing computing and information processing functions, e.g., quantum computing can employ quantum physics to encode and process information, rather than binary digital techniques based on transistors. That is, while classical computers can operate on bit values that are either 0 or 1, quantum computers operate on quantum bits that (qubits) that can comprise superpositions of both 0 and 1, can entangle multiple quantum bits (qubits), and use interference to affect other qubits. Quantum computing has the potential to solve problems that, due to their computational complexity, cannot be solved, either at all or for all practical purposes, by a classical computer.

The superposition principle of quantum physics can facilitate allowing qubits to be in a state that partially represent both a value of "1" and a value of "0" at the same time. The entanglement principle of quantum physics can facilitate allowing qubits to be correlated with each other such that the combined states of the qubits cannot be factored into individual separate qubit states. For instance, a state of a first qubit can depend on a state of a second qubit. As such, a quantum circuit can employ qubits to encode and process information in a manner that can be significantly different from binary digital techniques based on transistors.

In operation, the capacity of a qubit to operate can be affected by a variety of different environmental forces, e.g., radiation, light, sound, vibrations, heat, and magnetic fields, can all cause decoherence One of the characteristic properties of superconductors is that some electrons of the superconductor material are bound together in what is known as a Cooper pair, with each Cooper pair behaves as one charged particle. Cooper pairs have double the charge and mass of one electron. Supercurrent flowing in superconductors, which has zero direct current (DC) loss, can be a flow of Cooper pairs through the superconductor material. In some circumstances, the two electrons forming the Cooper pair have a binding energy keeping them together which is approximately the energy of the bandgap of the Superconductor. When a Cooper pair receives an energy excitation that is larger than the binding energy keeping the electrons together, the Cooper pair can break-up and form separate quasiparticles. Conversely, when two energetic quasiparticles lose their excitation and bind together, they can form a cooper pair.

One of the loss mechanisms in superconductors is quasiparticle loss, which can arise from a flow of unpaired electrons, or quasiparticles in the superconductor. Quasiparticles can be formed as a result of a variety of reasons: thermal excitation, photons absorption (e.g., infrared, cosmic rays), excess magnetic field, excess biasing current. Quasiparticles in superconducting microwave resonators, which can oscillate with the alternating current (AC) signal, can form an intrinsic loss channel for microwave photons, thus lowering the quality factor of these resonators. Quasiparticles in superconducting qubits can have negative effects. They can cause energy relaxation (the qubit changes its state) or dephasing (the qubit loses its phase coherence). Generally speaking, one or more embodiments can implement a quasiparticle trap by burying a trapping material inside the superconductor material. In on or more embodiments, this trapping material can trap quasiparticles such that negative effects are mitigated.

FIG. 1 illustrates a cross sectional view of example superconductor device 100 with buried material, in accordance with one or more embodiments. Superconductor device 100 can include substrate layer 110 and superconductor material 130 joined to substrate layer 110. As depicted, superconductor material 130 can include trapping material 150. With FIG. 1, the characteristics of a fabricated superconductor device 100 are discussed, and FIGS. 3-8 discuss different example approaches to fabricating superconductor devices similar to superconductor device 100. It should further be noted that, for introductory purposes, superconductor material 130 is depicted in FIG. 1 as being a single piece surrounding trapping material 150. As depicted in FIGS. 5C-8 however, in one or more embodiments, superconductor material 130 can be fabricated from multiple layers of material, e.g., first superconductor material layer 320, second superconductor material layer 310, and third superconductor material layer 568.

In one or more embodiments, trapping material can be a non-superconducting metal, this often being referred to as a normal-conductivity metal by ones having skill in the art. For example, normal-conductivity metals generally have very small but finite resistances for DC-currents, and superconducting materials generally have zero-resistance for DC-currents when they are cooled down below their critical temperature. Example normal-conductivity metals that can be used as a trapping material by one or more embodiments include, but are not limited to, palladium (Pd), gold (Au), silver (Ag), and copper (Cu).

In one or more embodiments, the burying of the trapping material within the superconductor material 130 can both trap quasiparticles in an effective way and avoid effects from the trapping material that can occur, e.g., forming lossy regions for microwave fields oscillating or propagating in the circuit, thus lowering the quality of the circuit.

Some implementations of quantum computing devices can use superconducting materials to facilitate different aspects of the devices. As noted above, some forces can be detrimental to the operation of quantum computing devices, e.g., use of some magnetic fields with quantum computing devices can have negative effects such as lowering the band gap, and interfering with flux-sensitive devices such as flux-tunable qubits. It should be noted that implementation of aspects of one or more embodiments, can facilitate features of various embodiments described herein without use of magnetic fields, e.g., quasiparticle trapping.

One or more embodiments described herein can use different technologies to solve problems that are highly technical in nature, including trapping quasiparticles in superconductors, that are not abstract and that cannot be performed as a set of mental acts by a human. Further, in certain embodiments, one or more embodiments can be employed to solve new problems that arise through advancements in technologies mentioned above, including superconductors, quantum computing, quantum decoherence reduction, computer architecture, and the like.

One or more embodiments described herein can provide technical improvements to the operation of superconductors, and can also provide technical improvements to operations performed by quantum computing devices (e.g., a superconducting quantum processor) by reducing the superconductor loss mechanisms that can cause energy relaxation or qubit loss of phase coherence, e.g., by trapping quasiparticles. In one or more implementations, the trapping of quasiparticles using the approaches described herein can improve the efficiency of the operation of superconductors. One or more embodiments can also improve the efficiency of quantum computing devices that use superconducting elements, e.g., by trapping quasiparticles with less, or no use of magnetic fields.

As described with FIG. 2 below, one or more embodiments can arrange the placement of trapping material in the superconductor device so as to avoid the negative effects described above.

Figure 2:
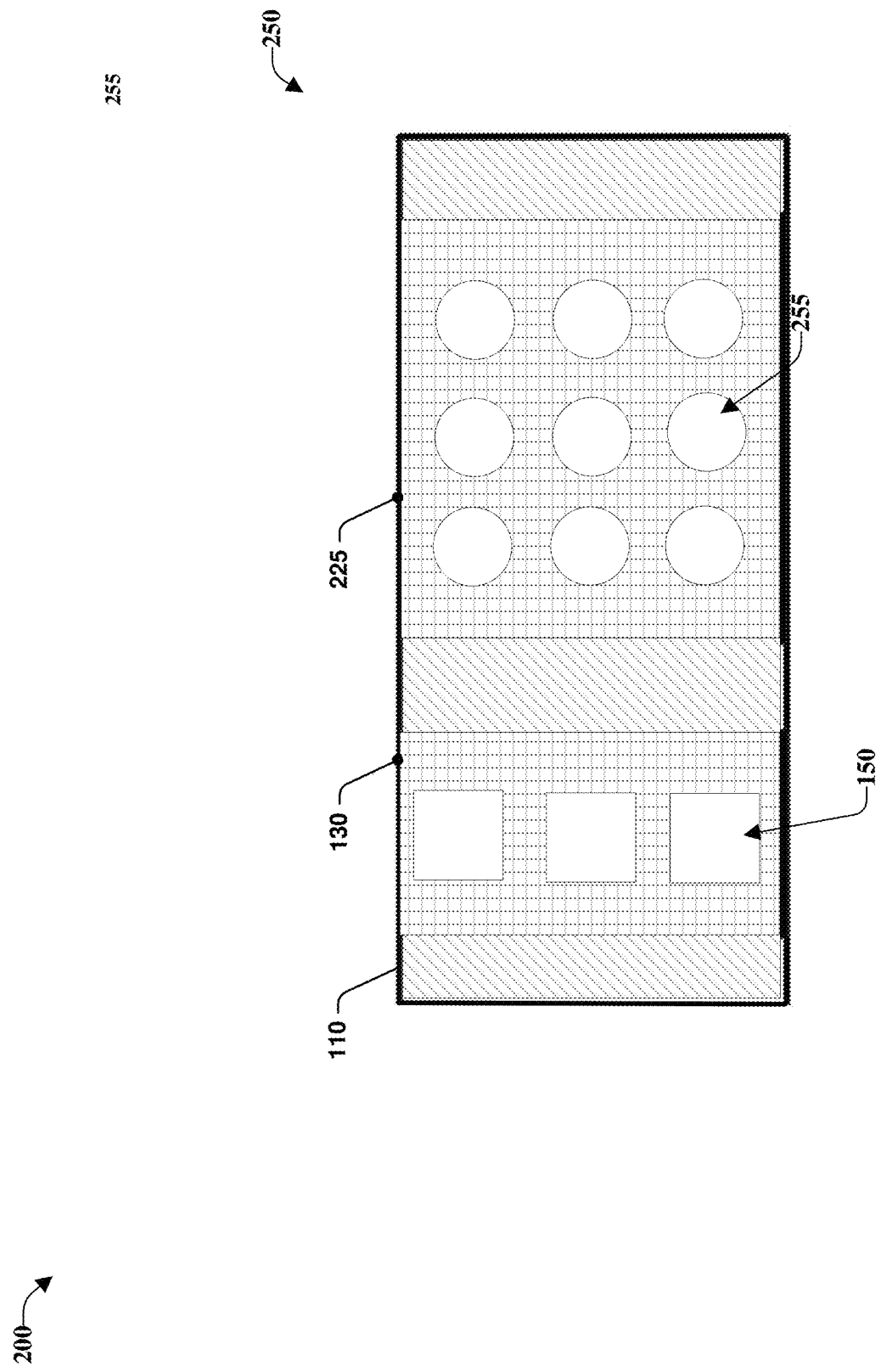
FIG. 2 illustrates an example lengthwise view of two superconductor devices with a trapping material, in accordance with one or more embodiments.

FIG. 2 illustrates an example 200 lengthwise view of two superconductor devices with trapping material 150, in accordance with one or more embodiments. Repetitive description of like elements and/or processes employed in respective embodiments is omitted for sake of brevity. Example 200 includes superconductor device 100 and superconductor device 250, joined to substrate layer 110. As depicted, trapping material 150 of superconductor device 100 and trapping material 150 of superconductor device 250, are buried into superconductor material to different depths, e.g., depth 115. Aspects of this depth are discussed with the fabrication of superconductor device 100 below. It should further be noted that superconductor device 100 and superconductor device 250, can have trapping material 150 and 255 of different sizes and scale. For example, trapping material 150 and trapping material 255 are of different shapes and relative placement. It would be appreciated by one having skill in the relevant art(s) given the description of embodiments herein. As noted above, FIGS. 3-8 and associated descriptions below describe different example approaches to fabricating superconductor device 100.

Figure 3:
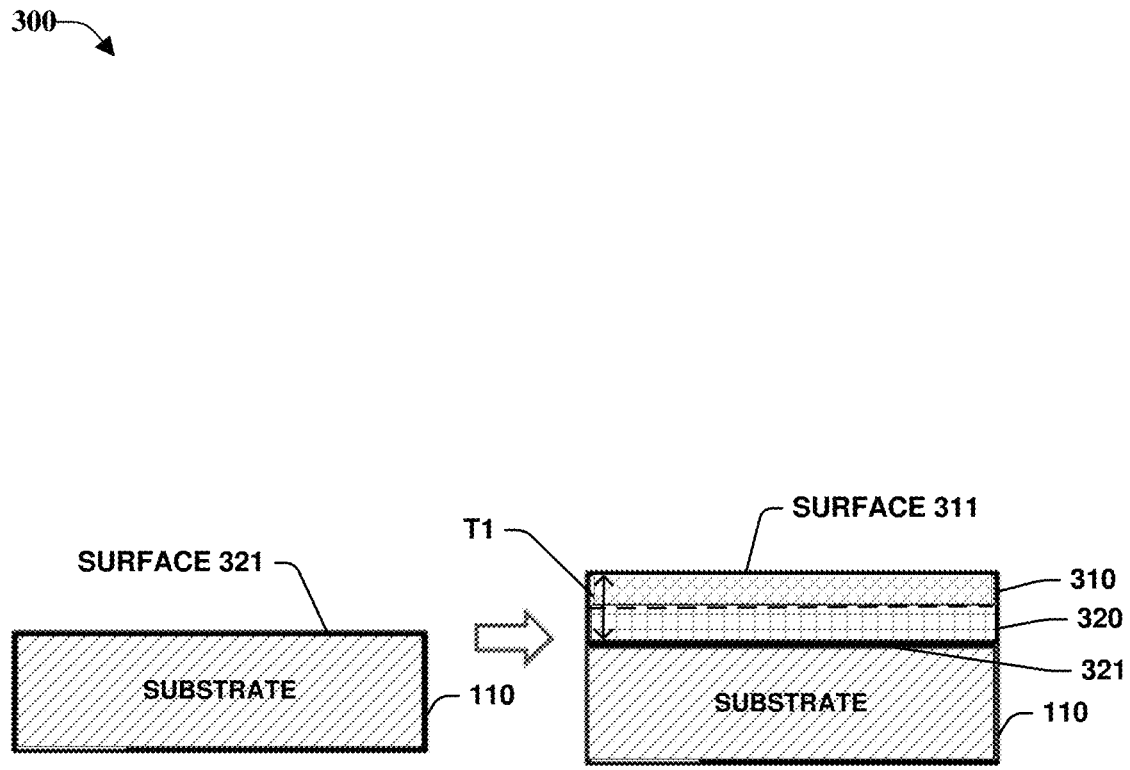
FIG. 3 illustrates an example 300 approach to fabricating a superconductor device, in accordance with one or more embodiments.

FIG. 3 illustrates an example 300 approach to fabricating a superconductor device, in accordance with one or more embodiments. Repetitive description of like elements and/or processes employed in respective embodiments is omitted for sake of brevity. Example 300 includes a substrate layer 110 having first superconductor material layer 320 joined to a first surface 321 of substrate layer 110. In one or more non-limiting embodiments, superconductor device 100 can be formed a layer at a time, starting at substrate layer 110 base layer, and adding layers sequentially on top of each other. As described with FIGS. 4-8 below, different approach to burying trapping material 150 within superconductor material 130, can use masking, etching, and other activities to form the structures of superconductor device 100 described herein.

In one or more embodiments described herein, material(s) used for substrate layer 110 can vary. In an aspect, substrate layer 110 can commonly comprise an undoped silicon (Si) wafer, but depending upon implementations of one or more embodiments can also use other commonly used substrates in microfabrication, including, but not limited to, sapphire, Germanium (Ge), silicon-on-insulator (SOI), Ge-rich strained SiGe-on-insulator (SGOI), and type III-V insulators. In one or more embodiments, the substrate can be doped or undoped, and be with or without non-conductive layers on top (e.g., oxide or nitride) depending on implementation. In the examples below, substrate layer 110 can be undoped Si.

In an example embodiment that can fabricate superconductor device 100 described above, first superconductor material layer 320 can be deposited on surface 321 of substrate layer 110. As described herein, the superconductor material layers, including first superconductor material layer 320, can include, but is not limited to, aluminum (Al), niobium (Nb), niobium nitride (NbN), niobium-titanium (NbTi), titanium nitride (TiN), tantalum (Ta), and niobium aluminide ($Nb_3Al$).

One or more embodiments adjust the thickness of superconductor layer based on a characteristic of the material selected to be the superconductor layer. In some embodiments, the characteristic is the London penetration depth ($\lambda$), which corresponds to the distance to which a magnetic field penetrates into a superconductor material. This value, which can generally range from tens to hundreds of nanometers (nm), depends on the superconductor material. One having skill in the relevant art(s), given the disclosure herein would appreciate that the London penetration depth of a superconducting material refers to the exponentially decaying of a magnetic field as it passes from the outside through the surface into the interior of a superconductor. In some circumstances, it is related to the density of superconducting electrons in the material.

Example London penetration depths ($\lambda$) for different superconducting materials include 16 nm for Al, 36 nm for Pb, and 39 for Nb, although one having skill in the relevant art(s), given the description would appreciate how to get the latest London penetration depths ($\lambda$) for different implementations of embodiments, and also appreciate that different factors can change the London penetration depths ($\lambda$) of different materials. It should further be noted that the use of London penetration depths ($\lambda$) for an enabling of the trapping operations of trapping materials discussed herein is not intended to be limiting. One having skill in the relevant art(s), given the description herein would appreciate that, through the implementation of different superconductor dimensions, different approaches to selecting the dimensions of one or more embodiments can be determined within the scope and spirit of embodiments taught and suggested by the present disclosure.

With respect to this value, one or more embodiments, can select a value for the thickness of first superconductor material layer 320 that is at least the London penetration depth. In this example, the London penetration depth of first superconductor material layer 320 is ($\lambda_1$). Referring back to the lengths of FIG. 1, in one or more embodiments, the thickness of first superconductor material layer 320 can correspond the length 125A in finished superconductor device 100 of FIG. 1. In one or more embodiments, a typical thickness of the first SC layer: 100-1000 nm.

Returning to example 300, after first superconductor material layer 320 is deposited on substrate layer 110, second superconductor material layer 310 can be deposited on surface 311, with the thickness (R) of this layer corresponding to length 120 of FIG. 1, e.g., a first dimension of the trapping material 150 buried in superconductor material 130. In one or more embodiments, R is typically between 20 and 150 nm. Further, with respect to the combined thickness (T1) of first superconductor material layer 320 and second superconductor material layer 310 (e.g., labeled at T1 in FIG. 3), in one or more embodiments, T1 exceeds ($\lambda_1$)+R.

FIG. 4A-4C illustrate additional aspects of an example approach to fabricating superconductor device 100, in accordance with one or more embodiments. FIG. 4A illustrates an example 400 aspect of an approach to fabricating a superconductor device, in accordance with one or more embodiments. placement and dimensions of buried trapping material 150 in superconductor material 130. Repetitive description of like elements and/or processes employed in respective embodiments is omitted for sake of brevity.

Example 400, continuing from the example 300 structure of FIG. 3, depicts masks 406A-B joined to surface 412 of second superconductor material layer 310. Example mask materials include, but are not limited to, soft mask (e.g., photo resist), hardmask (e.g., oxide or nitride, amorphous Si, carbon). Example approaches to patterning masks 406A-B include, but are not limited to, contact, photo, and e-beam lithography.

As will become apparent with the discussion of FIGS. 4B-4C below, the placement of masks 406A-B can determine the eventual placement and dimensions of trapping material 150 buried in superconductor device 100. For example, in the example superconductor devices 100 and 250 of FIG. 2, the respective placement and shape of the trapping material 150 and 255 in these devices can be determined by the placement of masks 406A-B at this stage, e.g., the shape of the traps can be circles, squares, rectangles or polygons, depending upon implementation specifics. In one or more embodiments, an example width/diameter of the traps is between 1 um-100 um, and the spacing between traps is between 1 um-100 um, e.g., much larger than the $\lambda$ value discussed above.

FIG. 4B depicts an example 402 of an approach to fabricating superconductor device 100, in accordance with one or more embodiments. Repetitive description of like elements and/or processes employed in respective embodiments is omitted for sake of brevity.

Example 402 continues the discussion of example 400 of FIG. 4A by removing unmasked portions of second superconductor material layer 310, e.g., by an etching process, such as a wet or plasma etching technique. As depicted in FIG. 4B, second superconductor material layer 310 is partially etched through (e.g., by a depth (R)) to first superconductor material layer 320, yielding recesses 422A-C and remaining material 408A-B of first superconductor material layer 320. This etching leaving a continuous layer in the bottom of recesses 422A-C, with a thickness at least the London penetration depth ($\lambda_1$) of first superconductor material layer 320.

As noted above, example 402 depicts result of a removal of unmasked portions of second superconductor material layer 310. In this example, masking and etching can be used, but other approaches can be used in accordance with different system requirements or approaches.

FIG. 4C illustrates an example 404 approach to fabricating a superconductor device, in accordance with one or more embodiments. Repetitive description of like elements and/or processes employed in respective embodiments is omitted for sake of brevity.

Example 404, continuing from the example 402 structure described above, depicts a removal of masks 406A-B, leaving remaining material 408A-B and recesses 422A-C, this etching leaving a continuous layer in the bottom of recesses 422A-C, with a thickness to substrate layer 110 of at least the London penetration depth ($\lambda_1$) of first superconductor material layer 320

FIG. 5A illustrates an example 500 approach to fabricating a superconductor device, in accordance with one or more embodiments. Repetitive description of like elements and/or processes employed in respective embodiments is omitted for sake of brevity.

In one or more embodiments, to facilitate the fabrication of one or more embodiments of superconductor device, trapping material 580 can be used to fill in recesses 422A-C, and overfilling can occur in some circumstances. It should be noted that, with respect to filling recesses 422A-C, as depicted in FIG. 5A, trapping material fills recesses 422A-C and is layered on to a height 582 higher than the brim of one or more recesses 422A-C. The thickness after etching can depend on the depth of the trap (R), and how the planarization technique is employed to remove excess material 584.

As depicted, recesses 422A-C are filled with trapping material 580 and excess trapping material forms an excess material layer over the second surface of the first superconductor layer. One having skill in the relevant art(s) (e.g., particularly superconductor fabrication), given the description herein, will appreciate that excess height above the brim of recesses 422A-C is not required for one or more embodiments, with filling underneath the brim, in some circumstances, being sufficient filling to form of the structures one or more embodiments. For example, if trapping material 580 that fills recess 422B is not filled to the brim of recess 422B, this could, after planarization 590, yield a trapping material 590B (of FIG. 5B) that is lower than the depicted height of second superconductor material layer 310, and in accordance with the general approaches to the layer-based fabrication described herein, can yield functional embodiments. It should be noted that, to illustrate several alternative embodiments, FIGS. 8A-8D below depict the uneven filling of recesses 422A-C and different approaches that can be used by one or more embodiments to form aspects of embodiments with these conditions.

Before filling in the quasiparticle traps with normal-conductivity material, in one or more embodiments, the surface of second superconductor material layer 310 and remaining material 408A-B can be pre-cleaned of any native oxide to ensure good electrical contact by chemical (e.g., dilute hydrofluoric acid (dHF) for niobium oxide) or physical etching (e.g., argon (Ar) sputtering). Further, in one or more embodiments, an in-situ process can be preferred to minimize native oxide regrowth in some circumstances.

FIG. 5B illustrates an example 502 approach to fabricating a superconductor device, in accordance with one or more embodiments. Repetitive description of like elements and/or processes employed in respective embodiments is omitted for sake of brevity In an embodiment where the trapping material is, as described above, a non-superconductive metal (e.g., a normal-conductivity metal), the planarization 590 process can be performed to recess trapping material back to the protruding studs of remaining material 408A-B. In one or more embodiments, planarizing 590 can be performed by employing chemical mechanical polishing (CMP). In this approach, CMP can initially be used to planarize, then excess thickness can be removed by additional CMP or other etching technique (wet or dry).

FIG. 5C illustrates an example 502 approach to fabricating a superconductor device, in accordance with one or more embodiments. Repetitive description of like elements and/or processes employed in respective embodiments is omitted for sake of brevity.

In one or more embodiments, a third superconductor material layer 568 can be deposited on surface 565 superconductor with the third superconductor material layer 568 having thickness above its London penetration depth. In some embodiments, third superconductor material layer 568 can have the same composition as the other two superconductor material layers discussed herein. In an example embodiment, all three superconductor material layers 310, 320, and 568 are comprised of the same superconducting material, e.g., Nb.

In an alternative embodiment, instead of using the same materials for the superconductor layers, in some circumstances different materials can be used for different layers. Thus, in an alternate implementation, first superconductor material layer 320 can be comprised of Nb, second superconductor material layer 310 can be comprised of Al, and third superconductor material layer 568 can also be comprised of Al. One having skill in the relevant art(s), given the description herein would appreciate that different materials can change the operation of superconductor material. It should be noted that one or more embodiments depend for selection of layer thicknesses upon the London penetration depth ($\lambda$) of particular superconductor materials. Thus, in an example where different superconductor material layers are composed of different elements, in some circumstances, different layers would have different thicknesses. In an alternative approach to handling different superconductor elements, one or more embodiments can select the largest London penetration depth ($\lambda$) and have all of the relevant thicknesses correspond to this highest value.

Figure 6B:
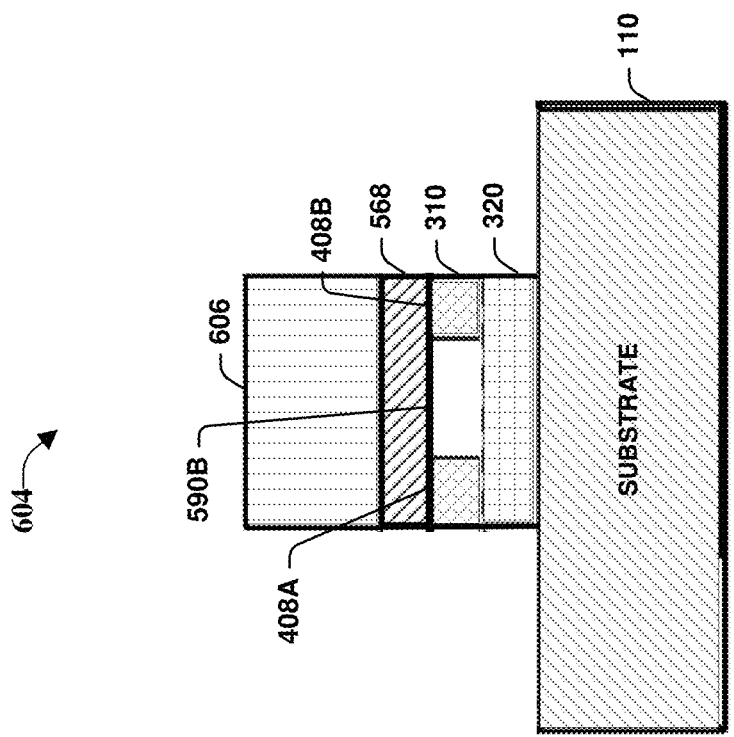
FIG. 6B depicts a fabricated superconductor structure after an etching process, in accordance with one or more embodiments.
Figure 6A:
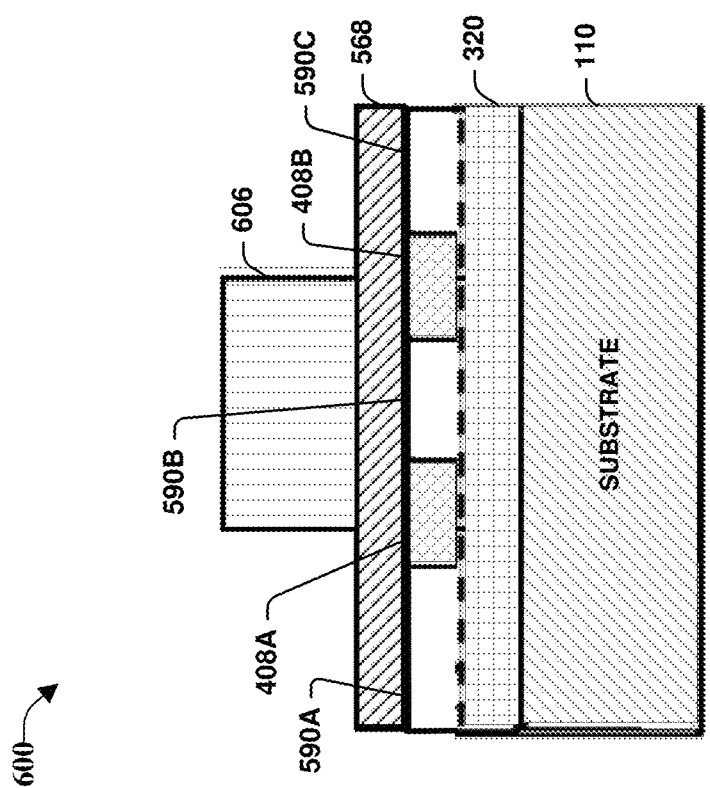
FIG. 6A illustrates an example approach to fabricating a superconductor device, in accordance with one or more embodiments.

FIG. 6A illustrates an example 602 approach to fabricating a superconductor device, in accordance with one or more embodiments. Repetitive description of like elements and/or processes employed in respective embodiments is omitted for sake of brevity.

To complete this example, in one or more embodiments, mask 606 can be utilized to remove additional materials from first superconductor material layer 320, second superconductor material layer 310, and third superconductor material layer 568. For example, because only the center portion of the structure in FIG. 6A is to be used, mask 606, combined with etching, can be used to remove excess material from the structure. FIG. 6B depicts a fabricated superconductor structure after an etching process, in accordance with one or more embodiments.

Figure 7:
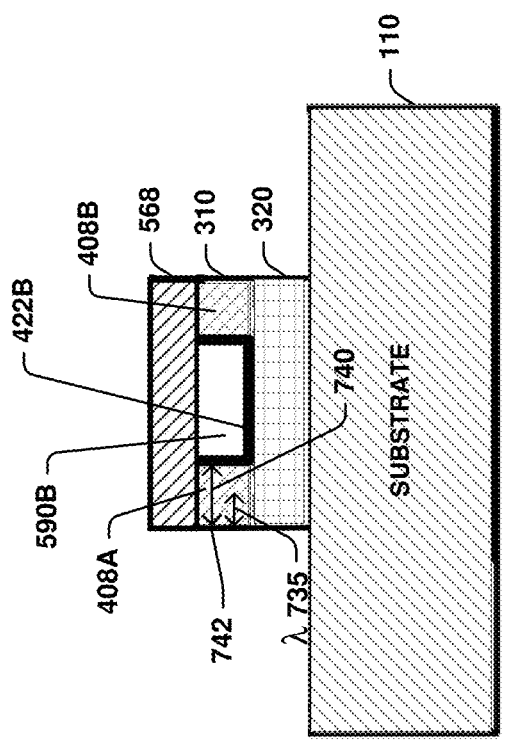
FIG. 7 illustrates an example approach to fabricating a superconductor device, in accordance with one or more embodiments.

FIG. 7 illustrates an example approach to fabricating a superconductor device 700, in accordance with one or more embodiments. Repetitive description of like elements and/or processes employed in respective embodiments is omitted for sake of brevity.

In one or more embodiments, the example of FIG. 7 can result from removal of mask 606. As depicted, superconductor device 700 has the originally deposited superconductor material layers identified, e.g., first superconductor material layer 320, second superconductor material layer 310, and third superconductor material layer 568. Formed recess 422B is depicted that contains trapping material 590B, e.g., as deposited with the operations described with 5B above. It should be noted that trapping material 590B is similar in placement to trapping material 150 described with FIG. 1.

As noted above, one or more embodiments can facilitate a particle trapping operation of trapping material (e.g., trapping material 590B) by burying the trapping material inside superconductor material to a distance exceeding the London penetration depth ($\lambda$) of the particular material. For example, with respect to trapping material 590B of FIG. 7, an example London penetration depth ($\lambda$) is depicted with depth 735, this depth being, the $\lambda$ of the superconductor material of which remaining material 408A-B of second superconductor material layer 310 is comprised, e.g., when second superconductor material layer 310 is comprised of Al, as discussed with FIG. 3 above, $\lambda$ is equal to 16 nm. Thus, for this example, the facilitate the operation of trapping material 590B to trap particles, depth 740 between the surface 742 of the remaining material 408A and trapping material 590B exceeds the 16 nm example $\lambda$ of Al, the material that comprises second superconductor material layer 310, e.g., an non-limiting example depth 740 being 32 nm. Stated differently, trapping material 590B is buried within second superconductor material layer 310 at a distance away from a surface (e.g., depth 740) of the superconductor material which exceeds a depth to which a magnetic field penetrates the superconductor material of the first superconductor layer, e.g., London penetration depth ($\lambda$) 735. Stated in yet a different way, as depicted, first superconductor material layer 310 (e.g., remaining material 408A) has a thickness (e.g., depth 740) exceeding a depth to which a magnetic field penetrates the superconductor material of which the first superconductor layer is comprised, e.g., London penetration depth ($\lambda$) 735.

One having skill in the relevant art(s), given the description herein, will appreciate that similar measurements can be applied to the sizes of third superconductor material layer 568 and first superconductor material layer 310.

FIGS. 8A-8D illustrates an example 800 alternative embodiment to the excess material approach described above with FIGS. 4B to 6B, in accordance with one or more embodiments. Repetitive description of like elements and/or processes employed in respective embodiments is omitted for sake of brevity. This alternative process diverges from the previously described approach at FIG. 4B described above, e.g., the stage at which trapping material 580 is deposited on to remaining material 408A-B (e.g., remaining from second superconductor layer 310), and recesses 422A-C.

Reviewing the previously described approaches can help illustrate that as depicted and described for the operations at FIG. 5A, trapping material 580 can often overflow the bounds of recesses 422A-C and remaining material 408A-B. Based on this, this previously discussed approach can employ a planarizing operation to recess the trapping material back to a useful height, e.g., filling recesses 422A-C and not substantially exceeding the height of remaining material 408A-B.

In this alternative embodiment, instead of the subtractive method described above (e.g., using the overfilling of normal-conductivity metal to fill in the normal-conductivity metal traps, then planarizing), an additive process could be used instead. In one or more embodiments, this alternative embodiment could be selected if the material in use does not have a compatible CMP process, or does not have a good selectivity for stopping the polish on top of the first remaining material 408A-B.

Figure 8A:
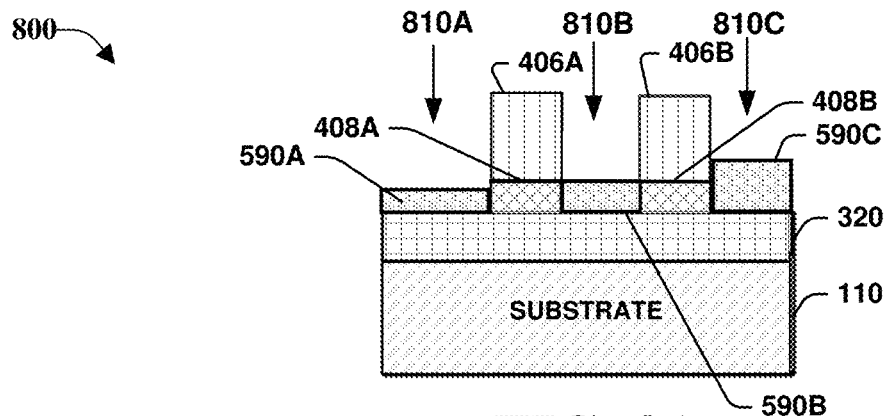
FIGS. 8A-8D illustrates an example 800 alternative embodiment to the excess material approach described above with FIGS. 4B to 6B, in accordance with one or more embodiments.

In this alternative embodiment, instead of depositing trapping material 580 all at once, with the masks 406A-B removed, such as is depicted in FIG. 5A, in this alternative, as depicted in FIG. 8A, masks 406A-B are not removed before deposition, and trapping material 580 is deposited in individual deposits between masks 406A-B, e.g., into recesses 590A-C via openings 810A-C respectively. If recesses 590A-C are filled with trapping material to match the thickness of remaining material 408A-B (e.g., recess 590B is filled to match remaining material 408A-B), from this process, then, in one or more embodiments, when masks 406A-B are removed, the alternative embodiment can return to following the first process described, e.g., shown at FIG. 5B. At FIG. 5B, each of the recesses 590A-C and remaining material 408A-B have a flat surface for deposition of third superconductor material layer 568. It should be recalled that, one of the reasons that, in the first embodiment, a flat surface can exist across recesses 590A-C and remaining material 408A-B is because at FIG. 5B, the surface was planarized 590 from the uneven surface in FIG. 5A to the flat plane of 5B.

Figure 8B:
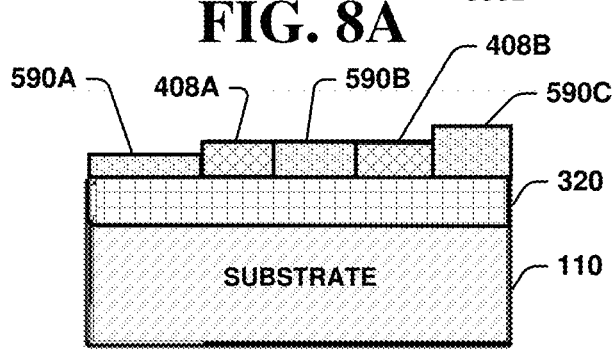

In many implementations however, as illustrated with FIGS. 8A-8B, the thickness of trapping material deposited can be uneven from unequal delivery, with the thickness of the deposited trapping material not matching the thickness of remaining material 408A-B. In a non-limiting example depicted in FIGS. 8A-B, three possible scenarios for the thickness of the deposited trapping material 580 are shown, e.g., in recess 590A, the trapping material is thin compared to remaining material 408A-B, in recess 590B, the trapping material is same thickness as remaining material 408A-B, and in recess 590C, the trapping material is thick compared to remaining material 408A-B. It is important to note that the actual thickness of the trapping material in fabrication can be only one of these scenarios, and not a mixture of them as shown in FIG. 8A and FIG. 8B. Stated differently, in this example, a depositing of trapping material in recess 590A results in a depositing of trapping material into recess 590A without forming an excess material layer (or sufficient material to reach the brim of recess 590A) over the surface of the first superconducting material layer 320, e.g., in contrast to the trapping material that fills recesses 590B-C.

Figure 8C:
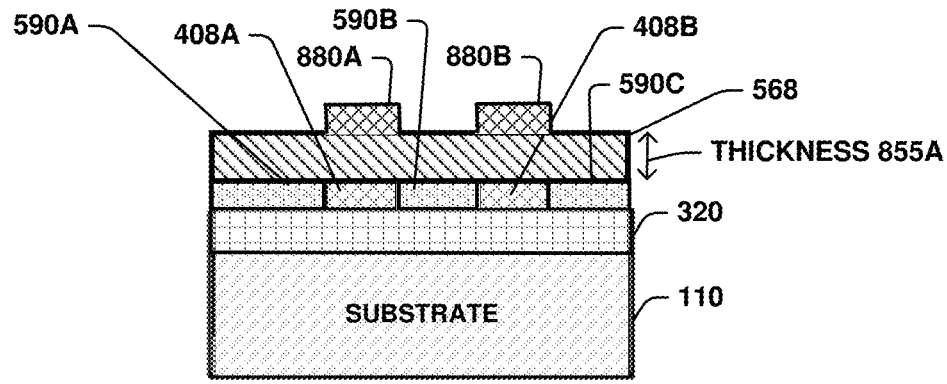

With reference to FIG. 8C, an example application of third superconductor material layer 568 is now discussed, where trapping material is deposited in all three recesses 590A-C to a thickness that is less than remaining material 408A-B. In this example, when third superconductor material layer 568 is applied, this material can fill in the spaces in recesses 590A-C where trapping material is thinner that remaining material 408A-B. In some implementations, this can result in raised portions 880A-B in superconductor material layer 568, where the layer covers remaining portions 408A-B. It is noted that the extra height in 408 A-B is merged with the superconductor material layer 568 in FIG. 8C.

In an alternative situation, when the deposited material in recesses 590A-C is thicker than remaining material 408A-B, when third superconductor material layer 568 is applied, this material can fill in the spaces between the thicker deposited trapping material in recesses 590A-C. In some implementations, this can result in raised portions in superconductor material layer 568, where the layer covers the trapping material in recesses 590A-C (not shown).

In one or more alternative embodiments, based on the example situations described above (e.g., raised portions in third superconductor material layer 568), a thicker than normal third superconductor material layer 568 can have been selected in advance to be applied over the uneven area. In addition to being thicker than normal, in some implementations, the thickness 855A can be above normal practices in exceeding the required London penetration depth ($\lambda$) for the superconductor material selected. Example implementations of superconductor thicknesses and London penetration depths ($\lambda$) are depicted with FIG. 7, discussed above.

Figure 8D:
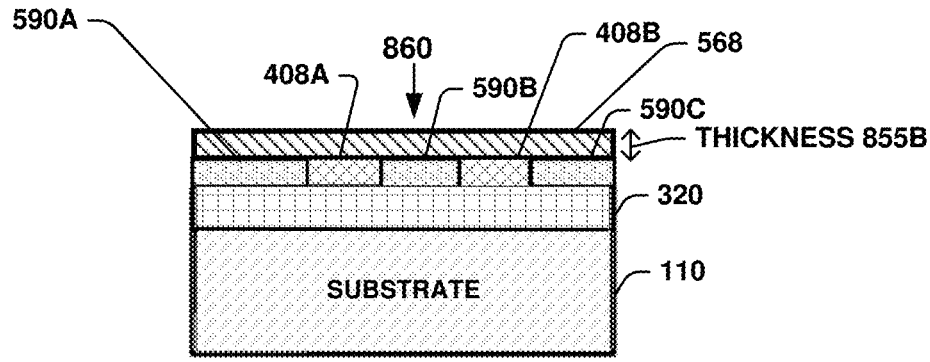

In one or more embodiments, the thickness 855A of third superconductor material layer 568 can have been selected so that, as depicted in FIG. 8D, the layer can be planarized down 860 to a thickness 855B that does not go below a minimum level, the London penetration depth ($\lambda$) of the composition of third superconductor material layer 568. In one or more embodiments, this planarization can be performed using CMP or some other etching technique supported by the composition of superconductor material layer 568.

Figure 9:
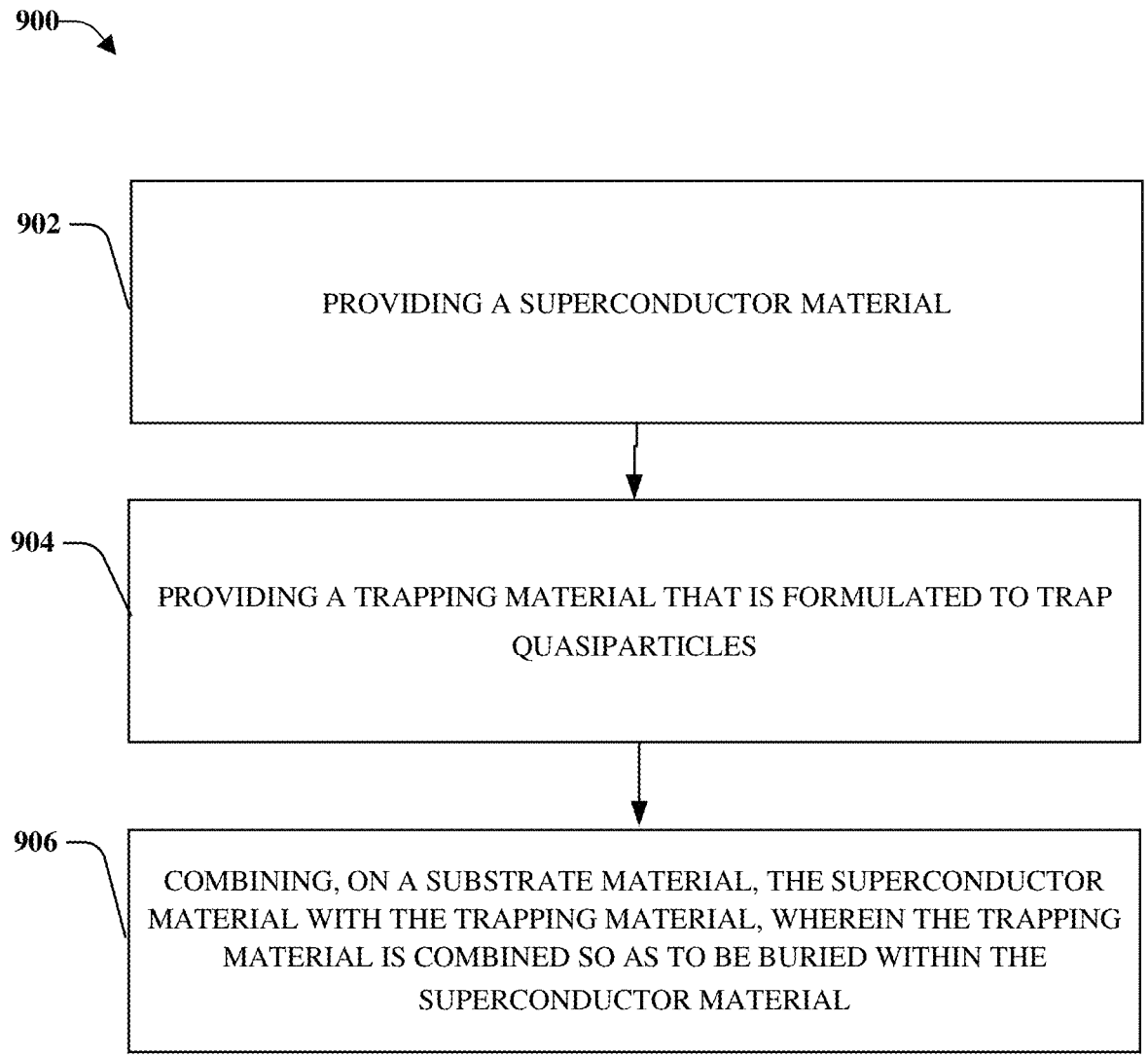
FIG. 9 illustrates a flow diagram of an example, non-limiting computer-implemented method that can facilitate fabricating a superconductor device, in accordance with one or more embodiments described herein.

FIG. 9 illustrates a flow diagram of an example, non-limiting method 900 that can facilitate fabricating a superconductor device that can trap quasiparticles, in accordance with one or more embodiments described herein. Repetitive description of like elements and/or processes employed in respective embodiments is omitted for sake of brevity.

In some embodiments, at 902, method 900 can comprise providing a superconductor material. In an example, as described herein, first superconductor layer 320 is provided to be deposited on substrate layer 110.

In some embodiments, at 904, method 900 can further comprise providing a trapping material that is formulated to trap quasiparticles. In an example, a trapping material (e.g., non-superconducting metal) is provided, and able to trap quasiparticles.

In some embodiments, at 906, method 900 can further comprise combining, on a substrate material, the superconductor material with the trapping material, wherein the trapping material is combined so as to be buried within the superconductor material. In an example, on substrate layer 110, first superconductor material layer 320 is combined with trapping material 580, and then covered (e.g., buried) by third superconductor material layer 568.

For simplicity of explanation, the computer-implemented methodologies described herein are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
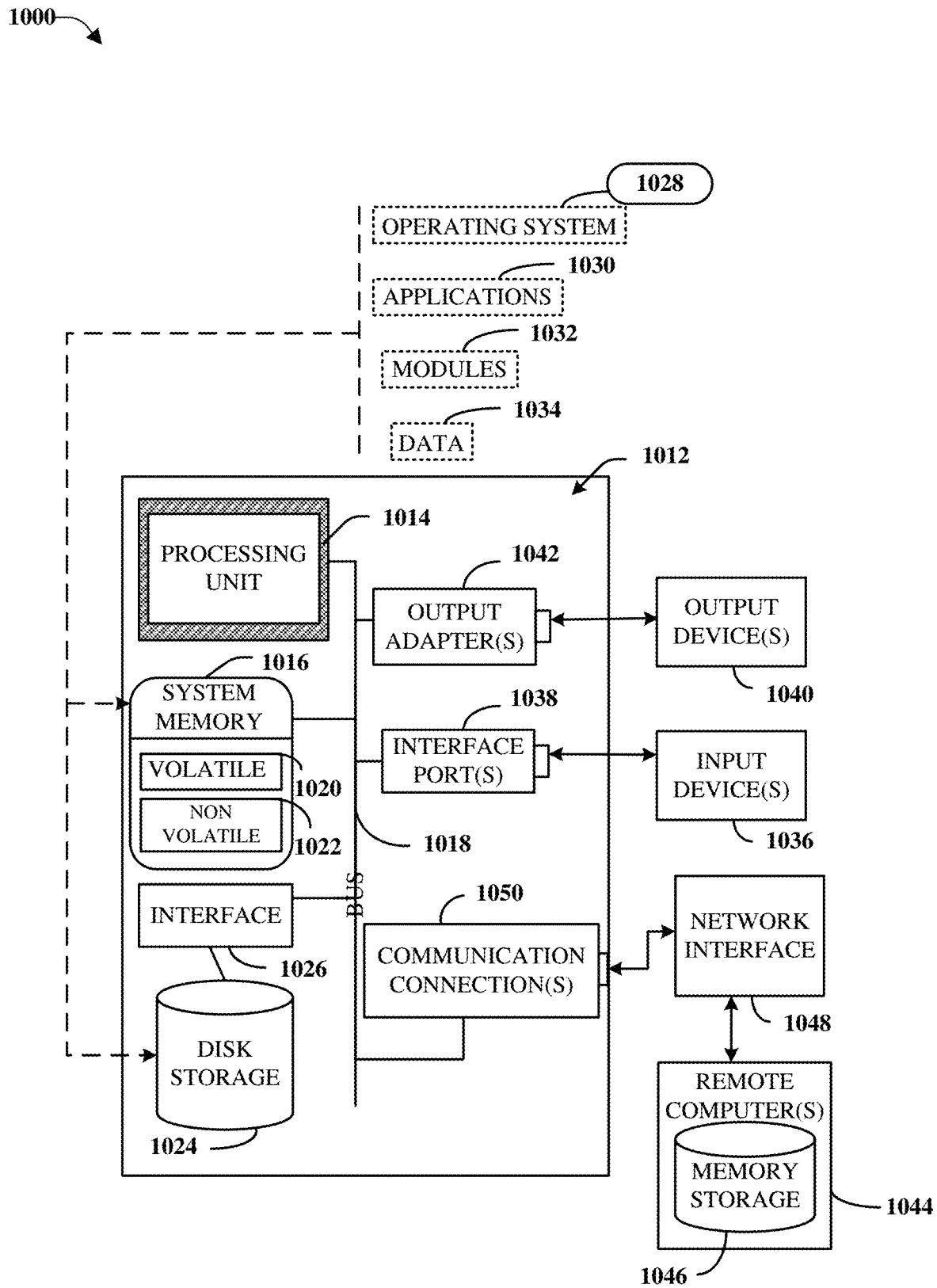
FIG. 10 illustrates a block diagram of an example, non-limiting operating environment in which one or more embodiments described herein can be facilitated.

FIG. 10 depicts an example context for various aspects of the disclosed subject matter, e.g., this figure, as well as the following discussion are intended to provide a general description of a suitable environment in which the various aspects of the disclosed subject matter can be implemented, in accordance with one or more embodiments. Repetitive description of like elements and processes employed in respective embodiments is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal, and external technologies such as, modems including regular telephone grade modems, cable modems and DSL modems, ISDN adapters, and Ethernet cards.

The present invention may be a system, a method, an apparatus, and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computer, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

Example types of signals that can be used by one or more embodiments include, but are not limited to, signals encoded in direct current (DC) and microwave signals. In some embodiments, signal lines and internal access lines can comprise electrically conductive components through which electrical current and/or electrical signals can flow. For example, signal lines and internal access lines can comprise electrically conductive components including, but not limited to, wires, traces, transmission lines, resonant buses, waveguides, and/or other components through which electrical current can flow. In some embodiments, signal lines and internal access lines can be fabricated using materials including, but not limited to, copper, copper alloys (e.g., copper nickel), gold, platinum, palladium, gold alloys (e.g., gold palladium), brass, or any conductive metal or alloy, e.g., alternating current and/or direct current) and/or electrical signals (e.g., microwave signals) can be relayed thereby.

In some embodiments, the various approaches of one or more embodiments described herein can be associated with various technologies. For example, various embodiments described herein can be associated with cryogenic technologies, cryogenic refrigerator technologies, microwave signal carrier technologies, superconductor fabrication technologies, printed circuit board technologies, quantum computing device technologies, quantum circuit technologies, quantum bit (qubit) technologies, circuit quantum electrodynamics (circuit-QED) technologies, quantum computing technologies, scalable quantum computing architecture technologies, surface code architecture technologies, surface code error correction architecture technologies, quantum hardware technologies, and/or other technologies.

Other technical improvements that can be provided by one or more embodiments described herein, are in areas of qubit coherence, that is, maintaining coherence in the qubits of quantum computing device 140 for as long as possible.

Additionally, in some embodiments, the approaches to trapping quasiparticles can provide technical improvements to a quantum processing unit associated with a quantum computing device, e.g., a quantum processor, quantum hardware etc. a circuit-QED system, and/or a superconducting quantum circuit. For example, as described above, one or more embodiments can provide an increased quantity of independent microwave signal transmission paths that can be utilized to transmit microwave signals to a quantum computing device. In this example, such quantum computing devices can comprise a quantum processor, and by providing independent microwave signals that can be transmitted to such a quantum processor, the device of the subject disclosure can facilitate improved performance of such a quantum processor (e.g., improved error correction, improved processing time, etc.).

In some embodiments, different implementations can solve problems that are highly technical in nature, that are not abstract and that cannot be performed as a set of mental acts by a human.

It is to be appreciated that one or more embodiments described herein can utilize various combinations of electrical components, mechanical components, and circuitry that cannot be replicated in the mind of a human or performed by a human. For instance, the amount of data transmitted, the speed of transmitting such data, and/or the types of data transmitted, can be greater, faster, or different than the amount, speed, and/or data type that can be transmitted by a human mind over the same period of time.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches, and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random-access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A superconductor device, comprising:
   a substrate layer;
   a first superconductor layer composed of a first superconductor material, on a first surface of the substrate layer; and
   a trapping material buried in the first superconductor layer, wherein the trapping material is formulated to trap quasiparticles.

2. The superconductor device of claim 1, wherein the trapping material is buried within the first superconductor layer at a distance away from a surface of the superconductor material which exceeds a depth to which a magnetic field penetrates the superconductor material of the first superconductor layer.

3. The superconductor device of claim 1, further comprising a second superconductor layer on a second surface of the first superconductor layer opposite to the first surface of the substrate layer, wherein the second superconductor layer contacts the trapping material.

4. The superconductor device of claim 3, wherein the second superconductor layer is composed of second superconductor material that is different from the first superconductor material.

5. The superconductor device of claim 3, wherein the second superconductor layer has a thickness exceeding a depth to which a magnetic field penetrates the superconductor material of which the first superconductor layer is comprised.

6. A method, comprising:
   depositing a first superconductor layer on a first surface of a substrate material; and
   burying a trapping material in the first superconductor layer, wherein the trapping material is formulated to trap quasiparticles.

7. The method of claim 6, wherein the burying the trapping material comprises:
   depositing the trapping material in a recess formed in a second surface of the first superconductor layer opposite to the first surface of the substrate material; and
   depositing a second superconductor layer on the second surface of the first superconductor layer, wherein the depositing of the second superconductor layer covers the recess and embeds the trapping material in the combined first superconductor layer and the second superconductor layer.

8. The method of claim 7, wherein the depositing of the trapping material in the recess comprises:
   depositing the trapping material on the second surface of the first superconductor layer, such that the recess is filled with the trapping material and excess trapping material forms an excess material layer over the second surface of the first superconductor layer; and
   removing the excess material layer.

9. The method of claim 7, wherein the depositing of the trapping material in the recess comprises depositing the trapping material in the recess without forming an excess material layer over the second surface of the first superconductor layer.

10. A method, comprising:
    providing a superconductor material;
    providing a trapping material that is formulated to trap quasiparticles; and
    combining, on a substrate material, the superconductor material with the trapping material, wherein the trapping material is combined so as to be buried within the superconductor material.

11. The method of claim 10, wherein the providing of the trapping material comprises discretely providing one or more pieces of the trapping material to facilitate the combining such that the trapping material is buried within the superconductor material.

12. The method of claim 11, wherein pieces of the buried trapping material pieces are spaced apart at a defined interval from one other.

13. The method of claim 11, wherein at least two of the pieces of the buried trapping material are formed to have the same shape.

14. The method of claim 13, wherein the same shape is a rounded shape.

15. The method of claim 13, wherein the same shape is a non-rounded shape.

16. The method of claim 11, wherein the buried trapping material pieces are formed along a ground plane of the superconductor material.

17. The method of claim 10, wherein the trapping material is comprised of a metallic material.

18. The method of claim 10, wherein the trapping material is combined so as to be buried within the superconductor material exceeding a depth to which a magnetic field penetrates the superconductor material.

19. The method of claim 10, wherein a first surface of the buried trapping material is formed to be separated from a second surface of the substrate material.

20. The method of claim 19, wherein the second surface of the substrate material is in contact with the superconductor material.

* * * * *